(12) United States Patent
Baek et al.

(10) Patent No.: US 9,747,984 B2
(45) Date of Patent: Aug. 29, 2017

(54) SEMICONDUCTOR DEVICE AND SEMICONDUCTOR SYSTEM

(71) Applicant: SK hynix Inc., Icheon-si Gyeonggi-do (KR)

(72) Inventors: Seung Geun Baek, Icheon-si (KR); Jae Il Kim, Icheon-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 15/049,795

(22) Filed: Feb. 22, 2016

(65) Prior Publication Data

US 2017/0062050 A1 Mar. 2, 2017

(30) Foreign Application Priority Data

Aug. 26, 2015 (KR) .......................... 10-2015-0120501

(51) Int. Cl.
*H03K 19/003* (2006.01)
*G11C 15/04* (2006.01)

(52) U.S. Cl.
CPC ................................... *G11C 15/04* (2013.01)

(58) Field of Classification Search
CPC .......... H03K 19/0005; H03K 19/00369; H04L 25/0278; H04L 25/0298
USPC ............... 326/21, 26–27, 30–33, 40, 82, 86; 327/108–109
See application file for complete search history.

(56) References Cited

U.S. PATENT DOCUMENTS

| 8,018,246 | B2 * | 9/2011 | Kaiwa | ................... | G11C 7/1051 |
| | | | | | 326/27 |
| 8,692,604 | B2 * | 4/2014 | Shon | .................... | H03K 5/2481 |
| | | | | | 326/30 |
| 9,559,691 | B1 * | 1/2017 | Kim | .................... | H03K 19/0005 |
| 2008/0001623 | A1 * | 1/2008 | Kim | .................... | H03K 19/0005 |
| | | | | | 326/30 |
| 2008/0048714 | A1 * | 2/2008 | Lee | ..................... | H03K 19/0005 |
| | | | | | 326/30 |
| 2009/0115449 | A1 * | 5/2009 | Kim | ........................ | G11C 5/063 |
| | | | | | 326/30 |
| 2010/0156455 | A1 * | 6/2010 | Yang | ......................... | G11C 7/04 |
| | | | | | 326/30 |
| 2010/0327903 | A1 * | 12/2010 | Park | ......................... | G11C 5/06 |
| | | | | | 326/30 |
| 2011/0074462 | A1 * | 3/2011 | Chung | ............... | H03K 19/0005 |
| | | | | | 326/30 |

(Continued)

FOREIGN PATENT DOCUMENTS

KR 1020110097442 A 8/2011

*Primary Examiner* — Jason M Crawford
(74) *Attorney, Agent, or Firm* — William Park & Associates Ltd.

(57) ABSTRACT

A semiconductor device may include a ZQ calibration circuit, a reference code setting circuit, a variable information generating circuit, and an internal circuit. The ZQ calibration circuit may perform a ZQ calibration operation in response to a ZQ calibration enable signal to generate a ZQ calibration code. The reference code generating circuit may output a predetermined code value as a reference code. The variable information generating circuit may compare the ZQ calibration code to the reference code to generate variable information. The internal circuit may determine operation timings based on a difference between the ZQ calibration code and the reference code.

19 Claims, 5 Drawing Sheets

(56) References Cited

U.S. PATENT DOCUMENTS

| | | | |
|---|---|---|---|
| 2011/0291699 A1* | 12/2011 | Cho | H04L 25/0298 326/30 |
| 2012/0081145 A1* | 4/2012 | Lee | G11C 7/1045 326/30 |
| 2012/0256655 A1* | 10/2012 | Kim | H03K 19/018557 326/30 |
| 2013/0113517 A1* | 5/2013 | Ko | H03K 19/0005 326/30 |
| 2013/0162286 A1* | 6/2013 | Lee | H03K 19/00315 326/30 |
| 2014/0266299 A1* | 9/2014 | Seol | H03K 19/0005 326/30 |
| 2016/0134285 A1* | 5/2016 | Ha | H03K 19/00369 326/30 |

* cited by examiner

SEMICONDUCTOR DEVICE AND SEMICONDUCTOR SYSTEM

CROSS-REFERENCES TO RELATED APPLICATION

The present application claims priority under 35 U.S.C. §119(a) to Korean application number 10-2015-0120501 filed on Aug. 26, 2015, in the Korean Intellectual Property Office, which is incorporated herein by reference in its entirety.

BACKGROUND

1. Technical Field

Various embodiments generally relate to a semiconductor integrated circuit, and more particularly to a semiconductor device and a semiconductor system.

2. Related Art

Transistors are components of semiconductor integrated circuits. Variations in process, supply voltage and temperature (PVT) have always been an issue in the fabrication of transistors. The PVT variations may affect the switching speed of the transistors in the semiconductor integrated circuits.

Deviations in the fabrication process of the semiconductor integrated circuits and variations in the supply voltage and temperature may result in malfunctions of the semiconductor integrated circuits.

SUMMARY

In an embodiment, a semiconductor device may include a ZQ calibration circuit, a reference code setting circuit, a variable information generating circuit, and an internal circuit. The ZQ calibration circuit may perform a ZQ calibration operation in response to a ZQ calibration enable signal to generate a ZQ calibration code. The reference code generating circuit may output a predetermined code value as a reference code. The variable information generating circuit may compare the ZQ calibration code to the reference code to generate variable information. The internal circuit may determine operation timings based on a difference between the ZQ calibration code and the reference code.

In an embodiment, a semiconductor system may include a controller and a semiconductor device. The controller may provide data, a control signal and a reference code setting signal to the semiconductor device. The semiconductor device may perform internal operations in accordance with the control signal. The semiconductor device may exchange the data with the controller. The semiconductor device may output one of predetermined code values as a reference code in response to the reference code setting signal. The semiconductor device may perform a comparison operation with respect to the reference code and a ZQ calibration code.

In an embodiment, a semiconductor device may include a ZQ calibration circuit, a reference code setting circuit and a subtracting circuit. The ZQ calibration circuit may generate a ZQ calibration code adjusted in accordance with a PVT variation. The reference code setting circuit may output a predetermined reference code which is constant regardless of the PVT variation. The subtracting circuit may perform a subtraction operation with respect to the ZQ calibration code and the reference code.

DETAILED DESCRIPTION

Figure 1:
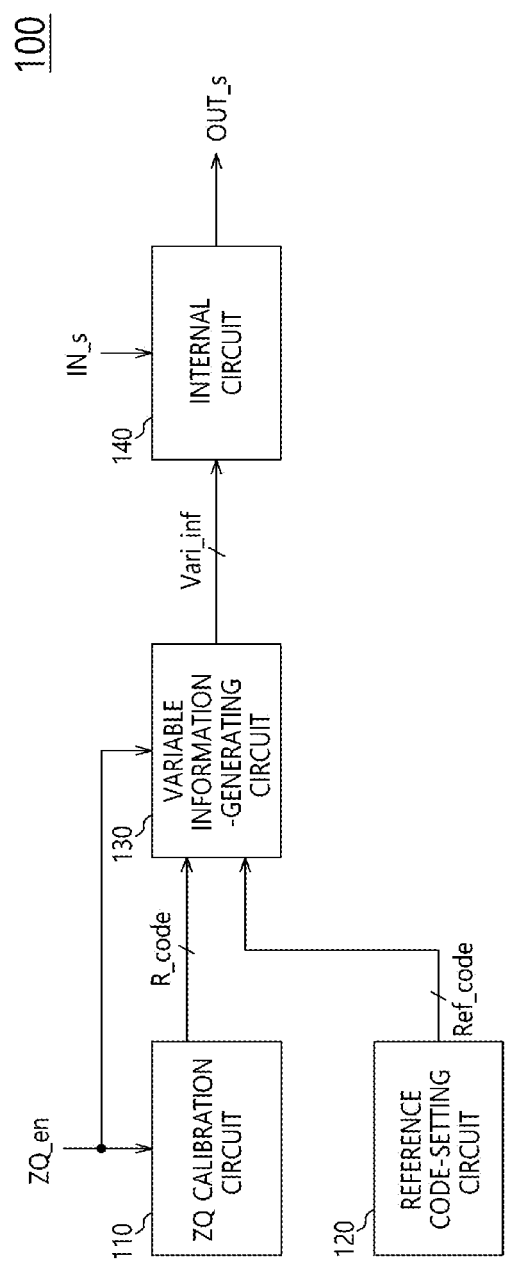
FIG. 1 is a diagram illustrating an example of a semiconductor device in accordance with example embodiments.

Various example embodiments will be described more fully hereinafter with reference to the accompanying drawings, in which some example embodiments are shown. The present invention may, however, be embodied in many different forms and should not be construed as limited to the example embodiments set forth herein. Rather, these example embodiments are provided so that this disclosure will be thorough and complete, and will fully convey the scope of the present invention to those skilled in the art. In the drawings, the sizes and relative sizes of layers and regions may be exaggerated for clarity.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, example embodiments will be explained in detail with reference to the accompanying drawings.

FIG. 1 is a diagram illustrating an example of a semiconductor device in accordance with example embodiments.

Referring to FIG. 1, a semiconductor device 100 may include a ZQ calibration circuit 110, a reference code setting circuit 120, a variable information generating circuit 130 and an internal circuit 140.

The ZQ calibration circuit 110 may perform a ZQ calibration operation in response to a ZQ calibration enable signal ZQ_en to generate a ZQ calibration code R_code. For example, if the ZQ calibration enable signal ZQ_en is enabled, the QZ calibration circuit 110 may perform the ZQ calibration operation to generate the ZQ calibration code R_code. The ZQ calibration operation may be performed to match impedance between the semiconductor device 100 and an external device. The ZQ calibration operation may adjust a driving force of an output driver in the semiconductor device 100 in accordance with the PVT variation when the semiconductor device 100 outputs signals (e.g., data signals) to a controller or other semiconductor devices.

The reference code setting circuit 120 may store and output a predetermined reference code Ref_code. An external device (e.g., controller) or a user may arbitrarily store the reference code Ref_code in the reference code setting circuit 120. For example, the reference code setting circuit 120 may include a data storage element such as a register, a mode register, a memory device, and a CAM.

The variable information generating circuit 130 may compare the ZQ calibration code R_code, which may vary according to the PVT variation, to the reference code Ref_code, which is a predetermined reference code. In an embodiment, the variable information generating circuit 130 may generate variable information Vari_inf in response to the ZQ calibration code R_code and the reference code Ref_code. For example, the variable information generating circuit 130 may generate the variable information by performing a subtraction operation on the ZQ calibration code R_code and the reference code Ref_code. The variable information Vari_inf may include information about the highest code among a subtracted code of the ZQ calibration code R_code and the reference code R_code, the ZQ calibration code R_code, and the reference code Ref_code.

The internal circuit 140 may adjust operation timing of an internal operation based on a difference between the ZQ calibration code R_code and the reference code Ref_code. In an embodiment, the internal circuit 140 may adjust operation timing of an internal operation based on the variable information Vari_inf. For example, when the internal circuit 140 performs a write operation, a read operation and a refresh operation, the internal circuit 140 may control operation timings of the write operation, the read operation and the refresh operation in accordance with the variable information Vari_inf. Further, if the internal circuit 140 includes a delay circuit, the internal circuit 140 may delay an input signal IN_s in accordance with the variable information Vari_inf to generate an output signal OUT_s.

Figure 2:
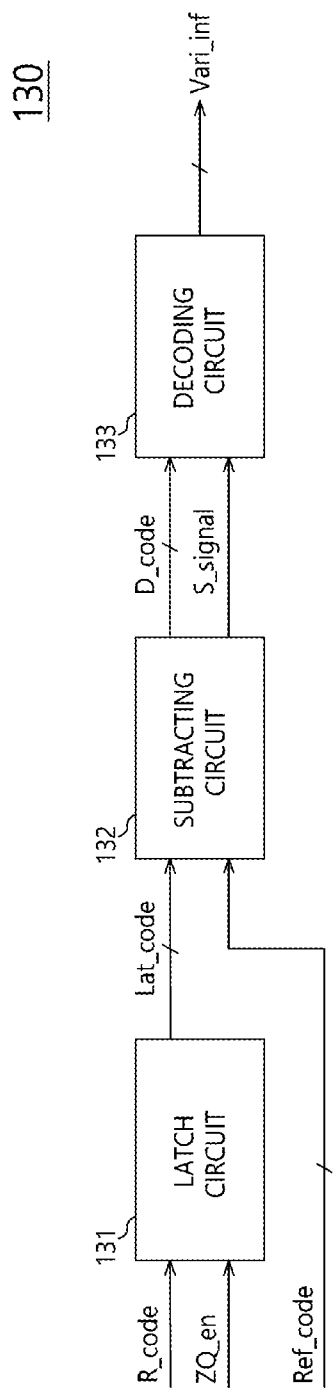
FIG. 2 is a diagram illustrating an example of a variable information-generating circuit illustrated in FIG. 1.

FIG. 2 is a diagram illustrating an example of a variable information generating circuit illustrated in FIG. 1.

Referring to FIG. 2, the variable information generating circuit 130 may include a latch circuit 131, a subtracting circuit 132, and a decoding circuit 133.

The latch circuit 131 may store the ZQ calibration code R_code updated by the ZQ calibration circuit 110 to generate a storage code Lat_code. The latch circuit 131 may store the ZQ calibration code R_code in response to the ZQ calibration enable signal ZQ_en. The latch circuit 131 may output the ZQ calibration code R_code as a storage code Lat_code. For example, the latch circuit 131 may store the ZQ calibration code R_code in response to the ZQ calibration enable signal ZQ_en enabled. The latch circuit 131 may output the stored code as the storage code Lat_code.

The subtracting circuit 132 may perform the subtraction operation on the storage code Lat_code and the reference code Ref_code to generate a subtract code D_code. The subtracting circuit 132 may generate a size signal S_signal including information about the highest code of the storage code Lat_code and the reference code Ref_code. For example, if the storage code Lat_code is the decimal number 4 and the reference code Ref_code is the decimal number 2, the subtracting circuit 132 may subtract the reference code Ref_code from the storage code Lat_code to generate the decimal number 2 as the subtract code D_code. The subtracting circuit 132 may enable the size signal S_signal if the storage code Lat_code is higher than the reference code Ref_code. In contrast, if the storage code Lat_code is the decimal number 1 and the reference code Ref_code is the decimal number 2, the subtracting circuit 132 may subtract the storage code Lat_code from the reference code R_code to generate the decimal number 1 as the subtract code D_code. The subtracting circuit 132 may disable the size signal S_signal if the storage code Lat_code is lower than the reference code Ref_code.

The decoding circuit 133 may decode the subtract code D_code and the size signal S_signal to generate the variable information Vari_inf. For example, if the subtract code D-code is the decimal number 3 and the size signal S_signal may be enabled, the decoding circuit 133 may generate the variable information including an increased value corresponding to three from a reference value. In contrast, when the subtract code D-code may be three and the size signal S_signal may be disabled, the decoding circuit 133 may generate the variable information including a decreased value corresponding to three from the reference value.

In example embodiments, the internal circuit 140 may include the variable delay circuit for controlling a delay time using the variable information Vari_inf. While the above example illustrates the internal circuit 140 including the variable delay circuit, the invention is not limited thereto.

Figure 3:
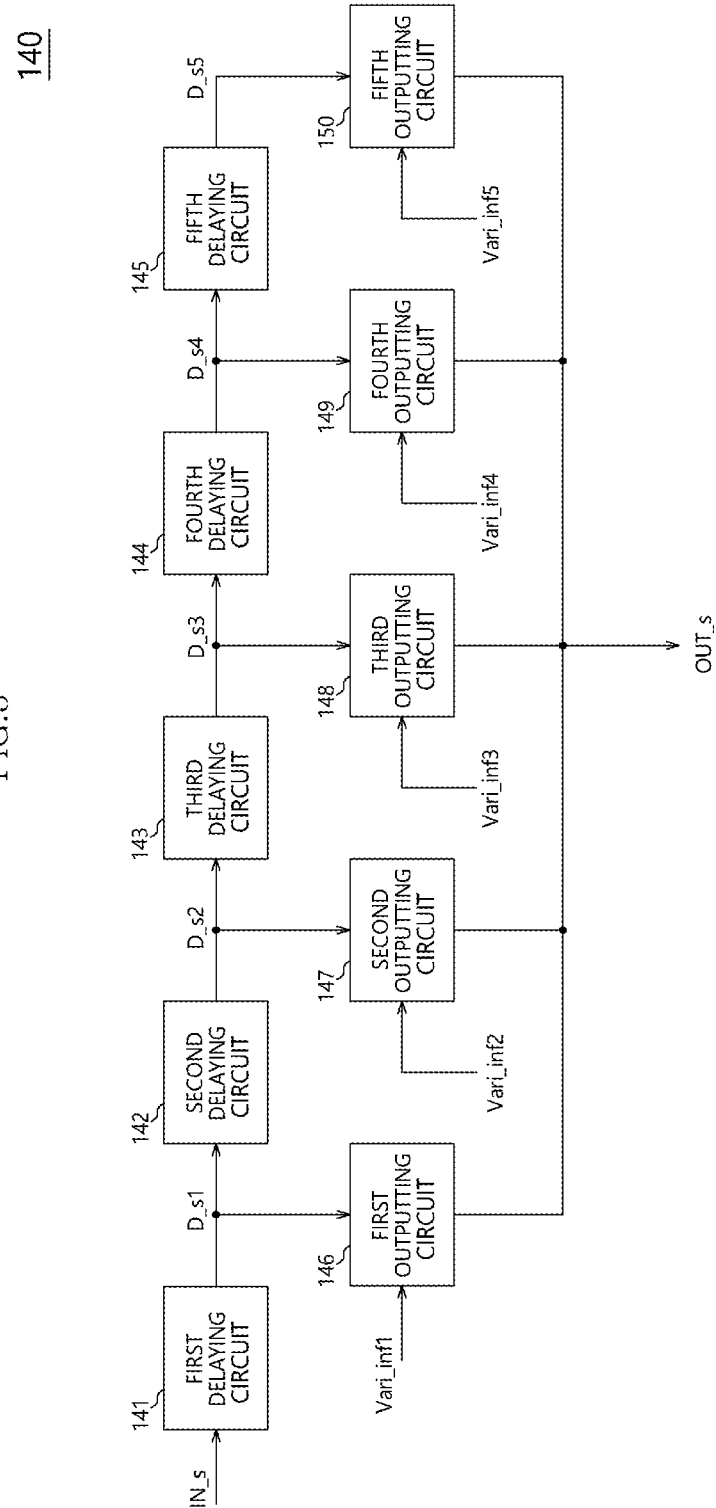
FIG. 3 is a diagram illustrating an example of an internal circuit illustrated in FIG. 1.

FIG. 3 is a diagram illustrating an example of an internal circuit illustrated in FIG. 1.

Referring to FIG. 3, the internal circuit 140 may include a first delaying circuit 141, a second delaying circuit 142, a third delaying circuit 143, a fourth delaying circuit 144, a fifth delaying circuit 145, a first outputting circuit 146, a second outputting circuit 147, a third outputting circuit 148, a fourth outputting circuit 149, and a fifth outputting circuit 150. The variable information Vari_inf may include first variable information Vari_inf1, second variable information Vari_inf2, third variable information Vari_inf3, fourth variable information Vari_inf4, and fifth variable information Varo_inf5.

The first delaying circuit 141 may receive the input signal IN_s. The first delaying circuit 141 may delay the input signal IN_s to output a first delay signal D_s1.

The second delaying circuit 142 may receive the first delay signal D_s1. The second delaying circuit 142 may delay the first delay signal D_s1 to output a second delay signal D_s2.

The third delaying circuit 143 may receive the second delay signal D_s2. The third delaying circuit 143 may delay the second delay signal D_s2 to output a third delay signal D_s3.

The fourth delaying circuit 144 may receive the third delay signal D_s3. The fourth delaying circuit 144 may delay the third delay signal D_s3 to output a fourth delay signal D_s4.

The fifth delaying circuit 145 may receive the fourth delay signal D_s4. The fifth delaying circuit 145 may delay the fourth delay signal D_s4 to output a fifth delay signal D_s5.

The first outputting circuit 146 may output the first delay signal D_s1 as the output signal OUT_s in response to the first variable information Vari_inf1. For example, in response to the first variable signal Vari_inf1 enabled, the first outputting circuit 146 may output the first delay signal D_s1 as the output signal OUT_s.

The second outputting circuit 147 may output the second delay signal D_s2 as the output signal OUT_s in response to the second variable information Vari_inf2. For example, in response to the second variable signal Vari_inf2 enabled, the second outputting circuit 147 may output the second delay signal D_s2 as the output signal OUT_s.

The third outputting circuit 148 may output the third delay signal D_s3 as the output signal OUT_s in response to the third variable information Vari_inf3. For example, in response to the third variable signal Vari_inf3 enabled, the third outputting circuit 148 may output the third delay signal D_s3 as the output signal OUT_s.

The fourth outputting circuit 149 may output the fourth delay signal D_s4 as the output signal OUT_s in response to the fourth variable information Vari_inf4. For example, in response to the fourth variable signal Vari_inf4 enabled, the fourth outputting circuit 149 may output the fourth delay signal D_s4 as the output signal OUT_s.

The fifth outputting circuit 150 may output the fifth delay signal D_s5 as the output signal OUT_s in response to the fifth variable information Vari_inf5. For example, in response to the fifth variable signal Vari_inf5 enabled, the fifth outputting circuit 150 may output the fifth delay signal D_s5 as the output signal OUT_s.

Hereinafter, operations of the semiconductor device 100 will be described in detail.

The semiconductor device 100 may be electrically connected to the external device. If the external device includes a controller, the semiconductor device 100 may be electrically connected to the controller.

The semiconductor device 100 may exchange signals with the controller. In order to exchange the signals without signal loss or degradation, the semiconductor device 100 may perform the ZQ calibration operation. The ZQ calibration operation may be performed to account for the PVT variation to tune output drivers and other termination values (e.g., on die termination values) for the purpose of the impedance matching. The ZQ calibration code generated by the ZQ calibration operation may be used for determining the driving force of the driver through which the signal from the semiconductor device 100 to the controller may be outputted.

In response to the ZQ calibration enable signal ZQ_en enabled, the ZQ calibration circuit 110 may perform the ZQ calibration operation to generate the ZQ calibration code R_code.

The reference code setting circuit 120 may store the reference code Ref_code arbitrarily set by the external device or the user. The reference code setting circuit 120 may output the reference code Ref_code.

The variable information generating circuit 130 may generate the variable information Vari_inf in response to the ZQ calibration code R_code and the reference code Ref_code.

The variable information generating circuit 130 may include the latch circuit 131, the subtracting circuit 132, and the decoding circuit 133.

The latch circuit 131 may store the ZQ calibration code R_code in response to the ZQ calibration enable signal ZQ_en enabled. The latch circuit 131 may output the stored code as the storage code Lat_code.

The subtracting circuit 132 may perform the subtraction operation on the storage code Lat_code and the reference code Ref_code to generate the subtract code D_code and the size signal S_signal. The subtract code D_code may be a difference in value between the storage code Lat_code and the reference code Ref_code. The size signal S_signal may include information about the highest code of the storage code Lat_code and the reference code Ref_code.

The decoding circuit 133 may decode the subtract code D_code and the size signal S_signal to generate the variable information Vari_inf.

The variable information generating circuit 130 may store the ZQ calibration code R_code whenever the ZQ calibration circuit 110 updates the ZQ calibration code R_code. The variable information generating circuit 130 may perform the subtraction operation on the stored code and the reference code Ref_code to generate the variable information Vari_inf.

The internal circuit 140 may include the first delaying circuit 141, the second delaying circuit 142, the third delaying circuit 143, the fourth delaying circuit 144, the fifth delaying circuit 145, the first outputting circuit 146, the second outputting circuit 147, the third outputting circuit 148, the fourth outputting circuit 149, and the fifth outputting circuit 150, which are coupled in series to each other. The variable information Vari_inf may select one of the first to fifth outputting circuit 146, 147, 148, 149, and 150. The variable information Vari_inf may include the first variable information Vari_inf1, the second variable information Vari_inf2, the third variable information Vari_inf3, the variable information Vari_inf4, and the fifth variable information Varo_inf5.

In response to the first variable information Vari_inf1 enabled, the output signal of the first delay circuit 141 may be output through the first outputting circuit 146 as the output signal of the internal circuit 140.

In response to the second variable information Vari_inf2 enabled, the output signal of the second delay circuit 142 may be output through the second outputting circuit 147 as the output signal of the internal circuit 140.

In response to the third variable information Vari_inf3 enabled, the output signal of the third delay circuit 143 may be output through the third outputting circuit 148 as the output signal of the internal circuit 140.

In response to the fourth variable information Vari_inf4 enabled, the output signal of the fourth delay circuit 144 may be output through the fourth outputting circuit 149 as the output signal of the internal circuit 140.

In response to the fifth variable information Vari_inf5 enabled, the output signal of the fifth delay circuit 145 may be output through the fifth outputting circuit 150 as the output signal of the internal circuit 140.

Thus, if the first variable information Vari_inf1 selected between the first to fifth variable information Vari_inf1, Vari_inf2, Vari_inf3, Vari_inf4 and Vari_inf5 is enabled, the internal circuit 140 may delay the input signal IN_s by a first delay time, which is the shortest delay time, to output the output signal OUT_s. If the second variable information Vari_inf2 selected between the first to fifth variable information Vari_inf1, Vari_inf2, Vari_inf3, Vari_inf4 and Vari_inf5 is enabled, the internal circuit 140 may delay the input signal IN_s by a second delay time, which is longer than the first delay time, to output the output signal OUT_s. If the third variable information Vari_inf3 selected between the first to fifth variable information Vari_inf1, Vari_inf2, Vari_inf3, Vari_inf4 and Vari_inf5 is enabled, the internal circuit 140 may delay the input signal IN_s by a third delay time, which is longer than the second delay time, to output the output signal OUT_s. If the fourth variable information Vari_inf4 selected between the first to fifth variable information Vari_inf1, Vari_inf2, Vari_inf3, Vari_inf4 and Vari_inf5 is enabled, the internal circuit 140 may delay the input signal IN_s by a fourth delay time, which is longer than the third delay time, to output the output signal OUT_s. If the fifth variable information Vari_inf5 selected between the first to fifth variable information Vari_inf1, Vari_inf2, Vari_inf3, Vari_inf4 and Vari_inf5 is enabled, the internal circuit 140 may delay the input signal IN_s by a fifth delay time, which is the longest delay time, to output the output signal OUT_s.

In example embodiments, the internal circuit of the semiconductor device 100 may adjust the delay time in accordance with comparison results between the ZQ calibration code and the reference code. The semiconductor device 100 in accordance with an example embodiment may compare the ZQ calibration code generated by the calibration operation with the reference code. The semiconductor device 100 may provide the comparison results to various internal circuits. Further, because the ZQ calibration code may be generated from the ZQ calibration circuit including a transistor and a resistance, the ZQ calibration code may vary in accordance with the PVT variation. Therefore, the semiconductor device may compare the ZQ calibration code with a constant code, which is constant regardless of the PVT variation, to detect the PVT variation.

Figure 4:
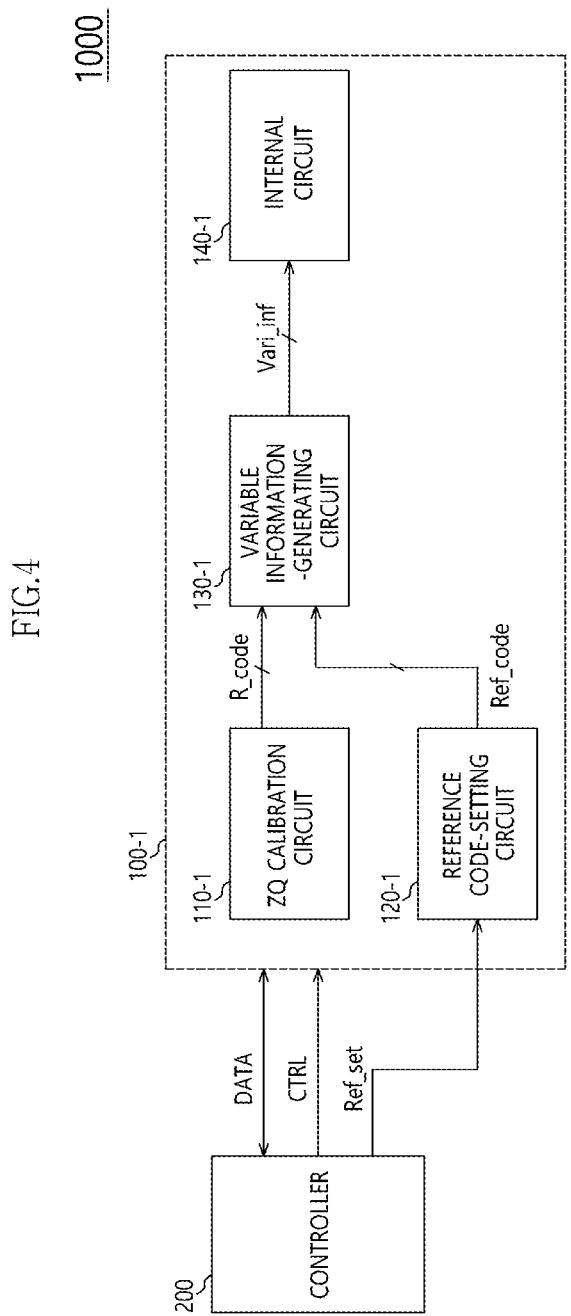
FIG. 4 is a diagram illustrating an example of a semiconductor system in accordance with example embodiments.

FIG. 4 is a diagram illustrating an example of a semiconductor system in accordance with example embodiments.

Referring to FIG. 4, a semiconductor system 1000 may include a controller 200 and a semiconductor device 100-1.

The controller 200 may exchange data with the semiconductor device 100-1. The controller 200 may transmit control signal CTRL, which may control operations of the semiconductor device 100-1, to the semiconductor device 100-1. The controller 200 may transmit a reference code-setting signal Ref_set to the semiconductor device 100-1.

The semiconductor device 100-1 may include a ZQ calibration circuit 110-1, a reference code setting circuit 120-1, a variable information generating circuit 130-1, and an internal circuit 140-1.

The ZQ calibration circuit 110-1 may have functions the same or substantially the same as those of the ZQ calibration circuit 110 in FIG. 1. For example, although not illustrated in FIG. 4, the ZQ calibration circuit 110-1 may perform a ZQ calibration operation in response to a ZQ calibration enable signal ZQ_en to generate a ZQ calibration code R_code. For example, in response to the ZQ calibration enable signal ZQ_en enabled, the QZ calibration circuit 110-1 may perform the ZQ calibration operation to generate the ZQ calibration code R_code. The ZQ calibration operation may be performed to account for the PVT variation to tune output drivers and other termination values for the purpose of the impedance matching. The ZQ calibration operation may adjust a driving force of output drivers in the semiconductor device 100-1 in accordance with the PVT variation when the semiconductor device 100-1 outputs signals (e.g., data signals) to a controller or other semiconductor devices.

The reference code setting circuit 120-1 may store and output a predetermined reference code Ref_code. An external device (e.g., a controller) or a user may arbitrarily store the reference code Ref_code in the reference code setting circuit 120-1. For example, the reference code setting circuit 120-1 may include a data storage element such as a register, a mode register, a memory device and a CAM. In example embodiments, the reference code setting circuit 120-1 may set a plurality of code values of the reference code Ref_code. Thus, the controller 200 may select the reference codes Ref_code.

The reference code setting circuit 120-1 may output one of the reference codes Ref_code in response to the reference code-setting signal Ref_set transmitted from the controller 200.

The variable information generating circuit 130-1 may generate variable information Vari_inf in response to the ZQ calibration code R_code and the reference code Ref_code. For example, the variable information generating circuit 130-1 may generate the variable information by performing a subtraction operation on the ZQ calibration code R_code and the reference code Ref_code. The variable information Vari_inf may include information about the highest code among a subtracted code of the ZQ calibration code R_code and the reference code R_code, the ZQ calibration code R_code and the reference code Ref_code.

The internal circuit 140-1 may adjust operation timing of an internal operation based on the variable information Vari_inf. For example, when the internal circuit 140-1 may perform a write operation, a read operation and a refresh operation, the internal circuit 140-1 may control operation timings of the write operation, the read operation and the refresh operation in accordance with the variable information Vari_inf. Further, if the internal circuit 140-1 includes a delay circuit, the internal circuit 140 may delay an input signal IN_s in accordance with the variable information Vari_inf to generate an output signal OUT_s.

Figure 5:
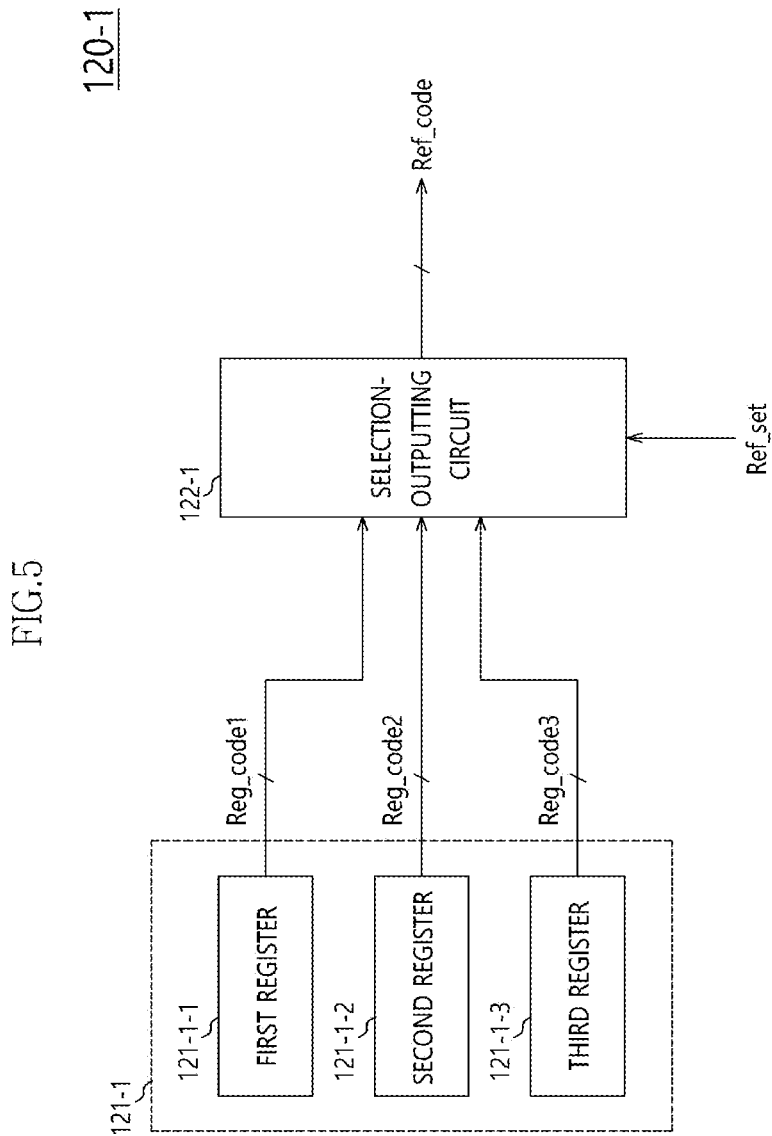
FIG. 5 is a diagram illustrating an example of a reference code-setting circuit illustrated in FIG. 4.

FIG. 5 is a diagram illustrating an example of a reference code-setting circuit illustrated in FIG. 4.

Referring to FIG. 5, the reference code setting circuit 120-1 may include a code table storing circuit 121-1 and a selection outputting circuit 122-1.

The code table-storing circuit 121-1 may include a first register 121-1-1, a second register 121-1-2, and a third register 121-1-3. An external device or a user may arbitrarily store code values in the first to third registers 121-1-1, 121-1-2, and 121-1-3. The first register 121-1-1 may output the stored code value as a first register code Reg_code1. The second register 121-1-2 may output the stored code value as a second register code Reg_code2. The third register 121-1-3 may output the stored code value as a third register code Reg_code3.

The selection-outputting circuit 122-1 may output one of the first register code Reg_code1, the second register code Reg_code2 and the third register code Reg_code3 as the reference code Ref_code in response to the reference code-setting signal Ref_set.

The ZQ calibration circuit 110-1, the variable information generating circuit 130-1 and the internal circuit 140-1 in FIG. 4 may be substantially the same as the ZQ calibration circuit 110, the variable information generating circuit 130 and the internal circuit 140 in FIG. 1, respectively. Thus, any further illustrations with respect to the ZQ calibration circuit 110-1, the variable information generating circuit 130-1 and the internal circuit 140-1 may be omitted herein for brevity.

Hereinafter, operations of the semiconductor device 1000 will be described in detail.

The semiconductor device 100-1 may be electrically connected with the controller 200.

The semiconductor device 100-1 may exchange the control signal CTRL and the data DATA with the controller 200. In order to exchange the data DATA without data loss, the semiconductor device 100-1 may perform the ZQ calibration operation. The ZQ calibration operation by the semiconductor device 100-1 may be performed to account for the PVT variation to tune output drivers and other termination values (e.g., on die termination values) for the purpose of the impedance matching. The ZQ calibration code generated by the ZQ calibration operation may be used for determining the driving force of the driver through which the data DATA from the semiconductor device 100-1 to the controller 200 may be outputted.

In response to the ZQ calibration enable signal ZQ_en enabled, the ZQ calibration circuit 110-1 may perform the ZQ calibration operation to generate the ZQ calibration code R_code.

The reference code setting circuit 120-1 may output any one of the reference codes Ref_code arbitrarily set by the external device or the user as the reference code Ref_code in response to the reference code setting signal Ref_set.

The variable information generating circuit 130-1 may generate the variable information Vari_inf in response to the ZQ calibration code R_code and the reference code Ref_code. The variable information generating circuit 130-1 may calculate a difference value between the ZQ calibration code R_code and the reference code Ref_code. The variable information generating circuit 130-1 may generate the difference value as a subtract code D_code. The variable information generating circuit 130-1 may generate information about sizes of the ZQ calibration code R_code and the reference code Ref_code as a size signal S_signal. The variable information generating circuit 130-1 may decode the subtract code D_code and the size signal S_signal to generate the variable information Vari_code.

The internal circuit 140-1 may include the first delaying circuit 141, the second delaying circuit 142, the third delaying circuit 143, the fourth delaying circuit 144, the fifth delaying circuit 145, the first outputting circuit 146, the second outputting circuit 147, the third outputting circuit 148, the fourth outputting circuit 149, and the fifth outputting circuit 150 coupled in series to each other as illustrated in FIG. 3. The variable information Vari_inf may include the first variable information Vari_inf1, the second variable information Vari_inf2, the third variable information Vari_inf3, the variable information Vari_inf4, and the fifth variable information Varo_inf5.

In response to the first variable information Vari_inf1 enabled, the output signal of the first delay circuit 141 may output through the first outputting circuit 146 as the output signal of the internal circuit 140.

If the first variable information Vari_inf1 selected between the first to fifth variable information Vari_inf1, Vari_inf2, Vari_inf3, Vari_inf4 and Vari_inf5 is enabled, the internal circuit 140 may delay the input signal IN_s by a first delay time, which is the shortest delay time, to output the output signal OUT_s. If the second variable information Vari_inf2 selected between the first to fifth variable information Vari_inf1, Vari_inf2, Vari_inf3, Vari_inf4 and Vari_inf5 is enabled, the internal circuit 140 may delay the input signal IN_s by a second delay time, which is longer than the first delay time, to output the output signal OUT_s. If the third variable information Vari_inf3 selected between the first to fifth variable information Vari_inf1, Vari_inf2, Vari_inf3, Vari_inf4 and Vari_inf5 is enabled, the internal circuit 140 may delay the input signal IN_s by a third delay time, which is longer than the second delay time, to output the output signal OUT_s. If the fourth variable information Vari_inf4 selected between the first to fifth variable information Vari_inf1, Vari_inf2, Vari_inf3, Vari_inf4 and Vari_inf5 is enabled, the internal circuit 140 may delay the input signal IN_s by a fourth delay time, which is longer than the third delay time, to output the output signal OUT_s. If the fifth variable information Vari_inf5 selected between the first to fifth variable information Vari_inf1, Vari_inf2, Vari_inf3, Vari_inf4 and Vari_inf5 is enabled, the internal circuit 140 may delay the input signal IN_s by a fifth delay time, which is the longest delay time, to output the output signal OUT_s.

In example embodiments, the internal circuit of the semiconductor device 100-1 may adjust the delay time in accordance with comparison results between the ZQ calibration code and the reference code. The semiconductor device 100-1 in accordance with an example embodiment may compare the ZQ calibration code generated by the calibration operation with the reference code. The semiconductor device 100-1 may provide the comparison results to various internal circuits. Further, because the ZQ calibration code may be generated from the ZQ calibration circuit including a transistor and a resistance, the ZQ calibration code may vary in accordance with the PVT variation. Therefore, the semiconductor device may compare the ZQ calibration code with a constant code, which is constant regardless of the PVT variation, to detect the PVT variation.

Further, in the semiconductor system 1000 in accordance with an example embodiment, a plurality of the codes may be set in the semiconductor device 100-1. The controller 200 may select one of the codes stored in the semiconductor device 100-1. The code selected by the controller 200 may be provided to the internal circuit 140-1 as the reference code Ref_code after performing the subtraction operation based on the ZQ calibration code ZQ_code. Thus, adjustments of impedance values based on the PVT variation of the internal circuit 140-1 may vary in accordance with the reference code Ref_code selected by the controller 200.

The above embodiment of the invention is illustrative and not limitative. Various alternatives and equivalents are possible. The invention is not limited by the embodiment described herein. Nor is the invention limited to any specific type of semiconductor device. Other additions, subtractions, or modifications are obvious in view of the invention and are intended to fall within the scope of the appended claims.

What is claimed is:

1. A semiconductor device comprising:
a calibration circuit configured to perform a ZQ calibration operation in response to a ZQ calibration enable signal to generate a ZQ calibration code;
a reference code setting circuit configured to output a predetermined code as a reference code;
a variable information generating circuit configured to compare the ZQ calibration code to the reference code to generate variable information; and
an internal circuit configured to determine operation timings based on a difference between the ZQ calibration code and the reference code.

2. The semiconductor device of claim 1, wherein the comparison operation of the variable information generating circuit includes a subtraction operation performed on the ZQ calibration code and the reference code to generate variable information.

3. The semiconductor device of claim 2, wherein the internal circuit configured to determine operation timings based on the variable information.

4. The semiconductor device of claim 3, wherein the variable information generating circuit generates the variable information by performing the subtraction operation with respect to the ZQ calibration code and the reference code outputted from the ZQ calibration circuit in response to the ZQ calibration enable signal, and the variable information includes a difference between the ZQ calibration code and the reference code, a code value of the ZQ calibration code and a code value of the reference code.

5. The semiconductor device of claim 4, wherein the variable information generating circuit comprises:
a latch circuit configured to store and output the ZQ calibration code as a storage code when the ZQ calibration enable signal is enabled;
a subtracting circuit configured to perform the subtraction operation with respect to the storage code and the reference code to generate a subtract code based on the difference between the ZQ calibration code and the reference code and to generate a size signal based on code values of the storage code and the reference code; and
a decoding circuit configured to decode the subtract code and the size signal to generate the variable information.

6. The semiconductor device of claim 1, wherein the internal circuit is configured to adjust a delay time in accordance with the difference between the ZQ calibration code and the reference code and to delay an input signal by the adjusted delay time and output a delayed input signal as an output signal.

7. The semiconductor device of claim 6, wherein the variable information includes the difference between the ZQ calibration code and the reference code.

8. The semiconductor device of claim 7, wherein the internal circuit comprises:
a plurality of delaying circuits coupled in series to each other; and
a plurality of outputting circuits configured to output one of output signals from the delaying circuits in accordance with the variable information.

9. The semiconductor device of claim 8, wherein each of the outputting circuits receives the output signal of a corresponding delaying circuit among the plurality of delaying circuits and outputs the input signal inputted from the corresponding delaying circuit as the output signal in accordance with the variable information.

10. A semiconductor system comprising:
a controller configured to transmit data, a control signal and a reference code setting signal to a semiconductor device; and
the semiconductor device configured to perform internal operations in accordance with the control signal, to exchange the data with the controller, to output one of predetermined codes as a reference code in response to the reference code setting signal, and to perform a comparison operation with respect to the reference code and a ZQ calibration code.

11. The semiconductor device of claim 10, wherein the comparison operation includes a subtraction operation performed on the reference code and a ZQ calibration code.

12. The semiconductor system of claim 11, wherein the semiconductor device comprises:
a reference code setting circuit configured to output one of the predetermined codes as the reference code in response to the reference code setting signal;
a calibration circuit configured to generate the ZQ calibration code;
a variable information generating circuit configured to perform a subtraction operation with respect to the ZQ calibration code and the reference code to generate variable information; and
an internal circuit configured to determine a delay time based on the variable information.

13. The semiconductor system of claim 12, wherein the reference code setting circuit comprises:
a code table storing circuit configured to store the codes; and
a selection outputting circuit configured to output one of the codes as the reference code in response to the reference code setting signal.

14. The semiconductor system of claim 12, wherein the variable information-generating circuit generates the variable information by performing the subtraction operation with respect to the ZQ calibration code and the reference code, and the variable information includes a difference between the ZQ calibration code and the reference code, a code value of the ZQ calibration code and a code value of the reference code.

15. The semiconductor system of claim 14, wherein the variable information-generating circuit comprises:
a latch circuit configured to store and output the ZQ calibration code as the storage code when the ZQ calibration circuit updates the ZQ calibration code;
a subtracting circuit configured to perform the subtraction operation with respect to the storage code and the reference code to generate a subtract code and a size signal; and
a decoding circuit configured to decode the subtract code and the size signal to generate the variable information.

16. The semiconductor system of claim 12, wherein the internal circuit comprises a plurality of delaying circuits coupled in series to each other, the internal circuit is configured to determine, based on the variable information, numbers of the delaying circuits through which output signals pass.

17. A semiconductor device comprising:
a calibration circuit configured to generate a ZQ calibration code adjusted in accordance with a PVT variation;
a reference code setting circuit configured to output a predetermined reference code which is constant regardless of the PVT variation; and a subtracting circuit configured to perform a subtraction operation with respect to the ZQ calibration code and the reference code.

18. The semiconductor device of claim 17, wherein the reference code setting circuit outputs one of set codes in response to a reference code setting signal.

19. The semiconductor device of claim 18, wherein the reference code setting circuit comprises:

a code table storing circuit configured to store the codes; and a selection outputting circuit configured to output one of the codes as the reference code in response to the reference code setting signal.

* * * * *